United States Patent
Lin et al.

(10) Patent No.: US 11,155,179 B2
(45) Date of Patent: *Oct. 26, 2021

(54) METHOD AND SYSTEM FOR BINDING BATTERY DEVICES TO CARRIER DEVICES

(71) Applicant: KWANG YANG MOTOR CO., LTD., Kaohsiung (TW)

(72) Inventors: Chen-Sheng Lin, Kaohsiung (TW); Chung-Jui Hung, Kaohsiung (TW); Yuh-Rey Chen, Taipei (TW); Po-Yu Chuang, Taipei (TW); Jen-Chiun Lin, Taipei (TW); Te-Chuan Liu, Taipei (TW)

(73) Assignee: KWANG YANG MOTOR CO., LTD., Kaohsiung (TW)

( * ) Notice: Subject to any disclaimer, the term of this patent is extended or adjusted under 35 U.S.C. 154(b) by 367 days.

This patent is subject to a terminal disclaimer.

(21) Appl. No.: 16/298,893

(22) Filed: Mar. 11, 2019

(65) Prior Publication Data
US 2019/0283621 A1    Sep. 19, 2019

(30) Foreign Application Priority Data
Mar. 13, 2018 (TW) ................... 107108408

(51) Int. Cl.
*H02J 7/00* (2006.01)
*B60L 53/65* (2019.01)
*G01R 31/392* (2019.01)
*G06K 19/06* (2006.01)
*H04B 5/00* (2006.01)
(Continued)

(52) U.S. Cl.
CPC .............. *B60L 53/65* (2019.02); *B60L 53/66* (2019.02); *B60L 53/80* (2019.02); *G01R 31/392* (2019.01); *G06K 19/06093* (2013.01); *H01M 10/425* (2013.01); *H01M 10/4221* (2013.01); *H04B 5/0031* (2013.01); *B60L 2270/34* (2013.01); *H01M 50/576* (2021.01);
(Continued)

(58) Field of Classification Search
CPC ........................................................ B60L 53/65
USPC ........................................................ 320/109
See application file for complete search history.

(56) References Cited

U.S. PATENT DOCUMENTS

2007/0090793 A1* 4/2007 Eguchi ................. H02J 7/1423
320/112
2013/0238238 A1* 9/2013 Hsuan .................... B62K 19/16
701/468
(Continued)

FOREIGN PATENT DOCUMENTS

EP    2489093 A1    8/2012
FR    2665559 A1    2/1992
(Continued)

OTHER PUBLICATIONS

European Search Report and Written Opinion received for EP Patent Application No. 19155685.1, dated Jul. 11, 2019, 7 pages.

*Primary Examiner* — Yalkew Fantu
(74) *Attorney, Agent, or Firm* — Womble Bond Dickinson (US) LLP (57) ABSTRACT

A system for battery binding includes a service end electronic device, at least one battery device and at least one carrier device. The service end electronic device is configured to send a carrier identifier corresponding to a carrier device to a battery device for storage therein in order to bind the battery device to the carrier device.

17 Claims, 7 Drawing Sheets

(51) Int. Cl.
*B60L 53/80* (2019.01)
*H01M 10/42* (2006.01)
*B60L 53/66* (2019.01)
H01M 50/576 (2021.01)
H01M 50/597 (2021.01)

(52) U.S. Cl.
CPC .. *H01M 50/597* (2021.01); *H01M 2010/4278* (2013.01); *H01M 2200/30* (2013.01); *H01M 2220/20* (2013.01)

(56) References Cited

U.S. PATENT DOCUMENTS

| | | | |
|---|---|---|---|
| 2013/0285616 A1* | 10/2013 | Washiro | H01M 10/44 320/134 |
| 2016/0068075 A1 | 3/2016 | Chen et al. | |
| 2018/0262891 A1* | 9/2018 | Wu | G07C 9/00857 |
| 2019/0280503 A1* | 9/2019 | Hsieh | G01R 31/371 |

FOREIGN PATENT DOCUMENTS

| | | |
|---|---|---|
| WO | 2011/083361 A1 | 7/2011 |
| WO | 2013/080211 A1 | 6/2013 |

\* cited by examiner

METHOD AND SYSTEM FOR BINDING BATTERY DEVICES TO CARRIER DEVICES

CROSS-REFERENCE TO RELATED APPLICATION

This application claims priority of Taiwanese Invention Patent Application No. 107108408, filed on Mar. 13, 2018.

FIELD

The disclosure relates to management of battery devices, and more particularly to techniques for binding battery devices to carrier devices.

BACKGROUND

With people's growing environmental awareness, electric vehicles (EVs) have been developed and are gaining public attention. Conventional electric vehicles use rechargeable and removable batteries installed therein as a source of electrical power. EV owners may purchase or rent the batteries for their use. Since the batteries need to be recharged, they have to be brought to, for example, a charging station from time to time. However, multiple batteries belonging to different owners may be simultaneously present at a charging station, so an EV owner may possibly retrieve a wrong battery (i.e., a battery that belongs to somebody else) when the charging process is finished. A mechanism is needed against such potential mistake.

SUMMARY

Therefore, the present disclosure aims at providing a secure and effective solution for binding batteries to carriers such that a battery can only be used by designated carrier(s). That is, the battery would not provide electrical power to any other carrier. In this way, rights to use the batteries that owners of the carriers bought or rented can be protected.

An object of the disclosure is to provide methods and systems for battery binding that can alleviate at least one of the drawbacks of the prior art.

According to the disclosure, one of the methods is to be implemented by an electronic device. The method includes steps of: obtaining a battery identifier corresponding to a battery device; obtaining a carrier identifier corresponding to a carrier device; determining whether the battery identifier thus obtained is identical to a battery identifier stored in the battery device; and sending the carrier identifier to the battery device via near-field communication for storage in the battery device when it is determined that the battery identifier thus obtained is identical to the battery identifier stored in the battery device.

According to the disclosure, another one of the methods is to be implemented by an electronic device and a battery device including a controller. The method includes steps of: obtaining, by the electronic device, a battery identifier corresponding to the battery device; obtaining, by the electronic device, a carrier identifier corresponding to a carrier device; sending, by the electronic device, the battery identifier thus obtained to the battery device; determining, by the controller of the battery device, whether the battery identifier received from the electronic device is identical to a battery identifier stored in the battery device; sending, by the controller of the battery device, a confirmation signal to the electronic device when it is determined that the battery identifier received from the electronic device is identical to the battery identifier stored in the battery device; and sending, by the electronic device upon receiving the confirmation signal, the carrier identifier to the battery device via near-field communication for storage in the battery device.

According to the disclosure, one of the systems includes a carrier device, a battery device configured to be installed in the carrier device to provide electrical power thereto, and an electronic device configured to communicate with the battery device. The electronic device is configured to obtain, from the battery device, a battery identifier of the battery device. The electronic device is configured to obtain, from the carrier device, a carrier identifier corresponding to the carrier device. The electronic device is configured to determine whether the battery identifier obtained from the battery device is identical to a battery identifier stored in the battery device. The electronic device is further configured to send the carrier identifier to the battery device via near-field communication for storage therein when it is determined that the battery identifier obtained from the battery device is identical to the battery identifier stored in the battery device.

According to the disclosure, another one of the systems includes a carrier device, a battery device configured to be installed in the carrier device to provide electrical power thereto, and an electronic device configured to communicate with the battery device. The electronic device is configured to communicate with said battery device (12) and configured to obtain, from the battery device, a battery identifier of the battery device. The electronic device is configured to obtain, from the carrier device, a carrier identifier corresponding to the carrier device. The electronic device is further configured to send the battery identifier to the battery device. The battery device includes a controller. The controller is configured to determine whether the battery identifier received from the electronic device is identical to a battery identifier stored in the battery device. The controller is further configured to send a confirmation signal to the electronic device when it is determined that the battery identifier received from the electronic device is identical to the battery identifier stored in the battery device. The electronic device is further configured to send, upon receiving the confirmation signal from the battery device, the carrier identifier to the battery device via near-field communication for storage therein.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
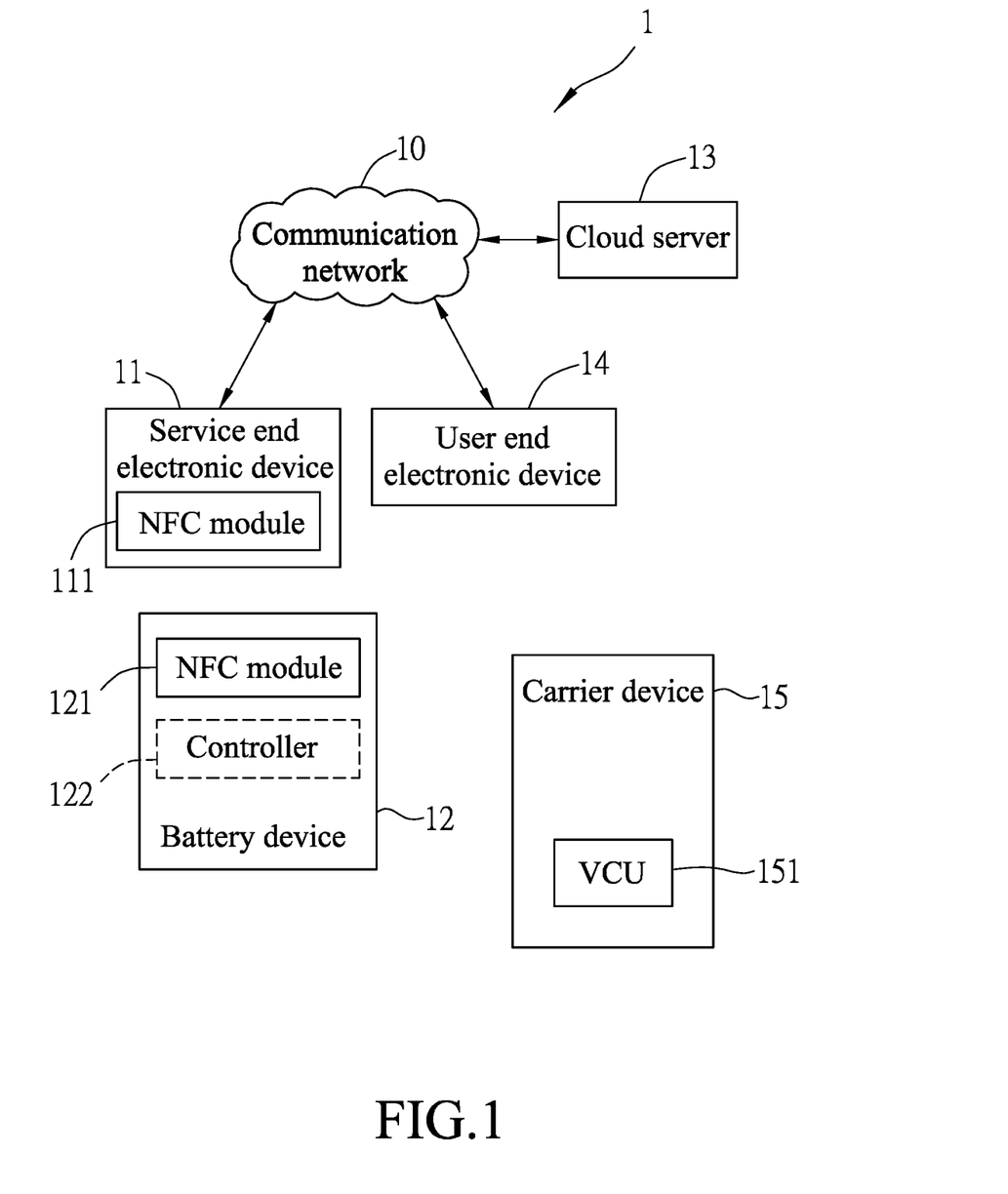
FIG. 1 is a block diagram which exemplarily illustrates a system for battery binding according to an embodiment.

FIG. 1 is a block diagram which exemplarily illustrates a system 1 for battery binding according to an embodiment. Referring to FIG. 1, the system 1 includes a service end electronic device 11, at least one battery device 12, a cloud server 13, a user end electronic device 14 and at least one carrier device 15. The service end electronic device 11 and the user end electronic device 14 are configured to communicate with the cloud server 13 over a communication network 10 (e.g., the Internet). In an embodiment, the service end electronic device 11 may be a mobile device of an EV vendor, and the user end electronic device 14 may be a mobile device of an owner/user of one of the carrier device(s) 15.

According to an embodiment, each of the service end electronic device 11 and the battery device(s) 12 includes a near-field communication (NFC) module 111, 121, such that the service end electronic device 11 may communicate with the battery device(s) 12 via near-field communication. According to an embodiment, each of the battery device(s) 12 may further include a controller 122 electrically coupled to the NFC module 121. Each of the battery device(s) 12 may be a removable and rechargeable battery configured to be installed in one of the carrier device (s) 15 to provide electrical power thereto. Each of the carrier device (s) 15 may be a battery electric vehicle (BEV) or a hybrid electric vehicle (hybrid EV) that is a motorcycle, an automobile, a bus or the like.

According to an embodiment, each of the battery device(s) 12 has a unique battery identifier. Before being delivered to a vendor, a barcode associated with the battery identifier of the battery device 12 may be positioned on the battery device 12 (e.g., on a top portion of the battery device 12), such that the battery identifier may be obtained through the barcode. For example, in an embodiment, the service end electronic device 11 may obtain the battery identifier of a battery device 12 by scanning the barcode on the battery device 12 through a first application program installed in the service end electronic device 11 after downloading the same from the cloud server 13 over the communication network 10. The barcode may be a one-dimensional (1D) barcode or a two-dimensional (2D) barcode (e.g., a Quick Response code (QR code)). The battery identifier of the battery device 12 may also be stored in the battery device 12, such that the battery identifier may be obtained through data communication with the battery device 12. For example, in an embodiment, the service end electronic device 11 may obtain the battery identifier of a battery device 12 by communicating with the battery device 12 via near-field communication through the NFC modules 111, 121 thereof.

According to an embodiment, each of the carrier device(s) 15 has a unique carrier identifier. According to an embodiment, before being delivered to a vendor, a barcode associated with the carrier identifier of the carrier device 15 may be positioned on the carrier device 15, such that the carrier identifier may be obtained through the barcode. For example, in an embodiment, the service end electronic device 11 may obtain the carrier identifier of a carrier device 15 by scanning the barcode on the carrier device 15 through the first application program installed in the service end electronic device 11. The barcode may be a 1D barcode or a 2D barcode (e.g., a QR code).

Figure 2:
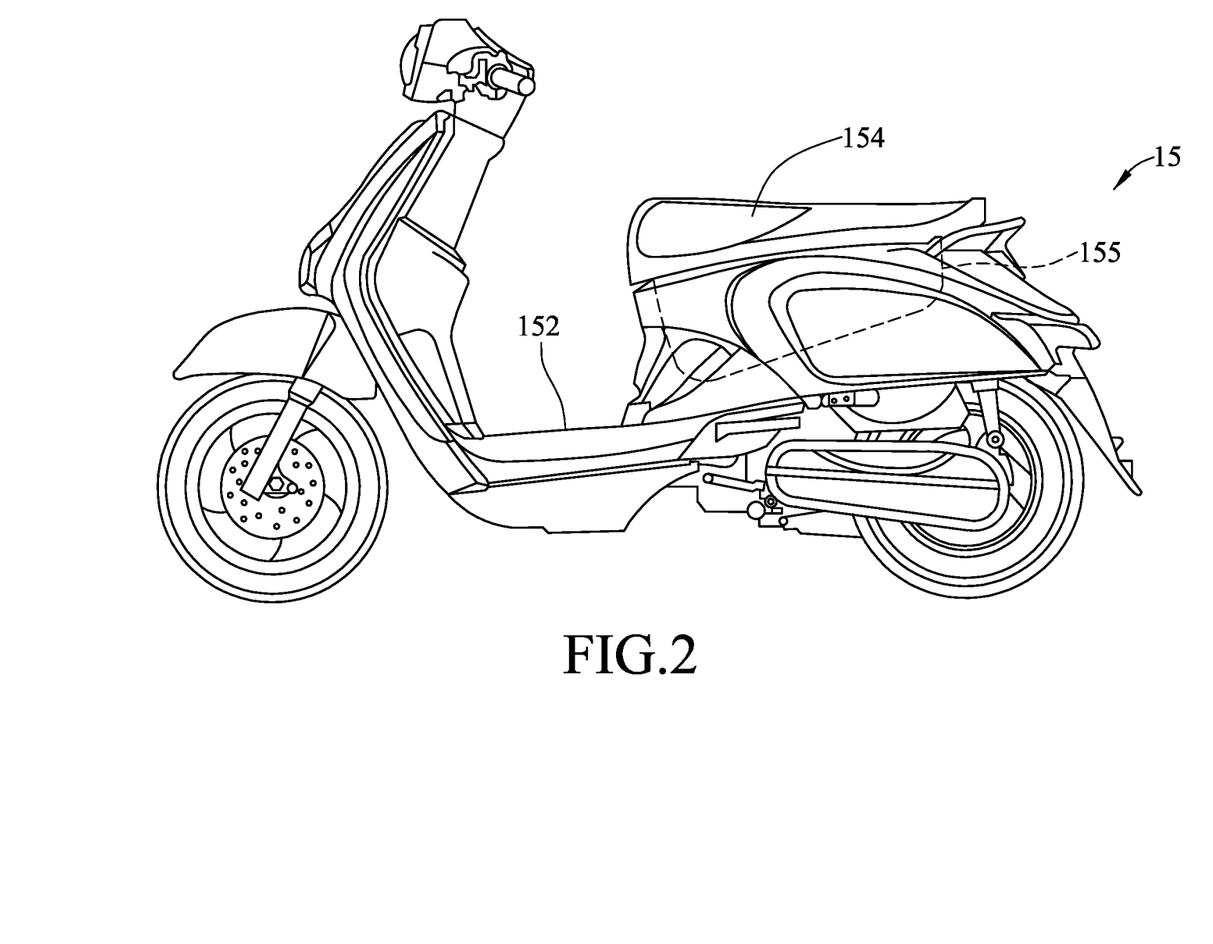
FIG. 2 exemplarily illustrates a carrier device according to an embodiment.
Figure 3:
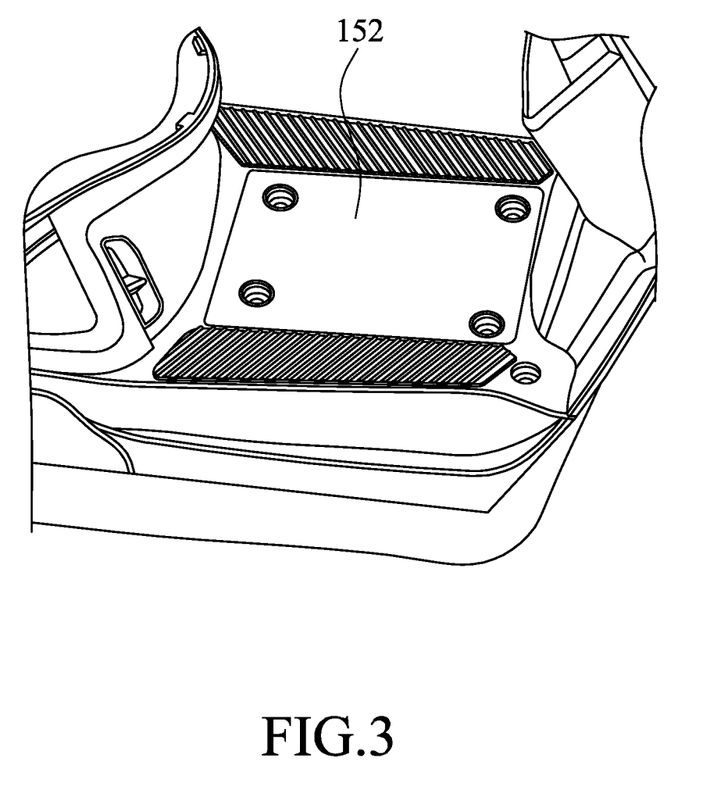
FIG. 3 exemplarily illustrates a footboard of a carrier device according to an embodiment.
Figure 4:
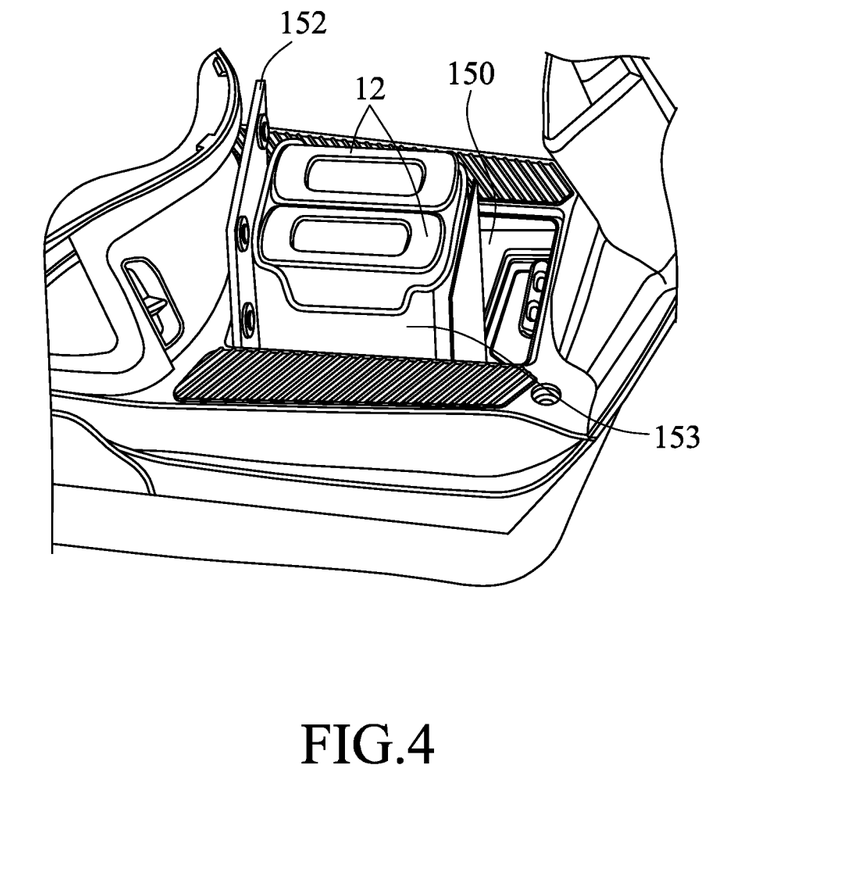
FIG. 4 exemplarily illustrates a battery box of a carrier device according to an embodiment.

FIG. 2 exemplarily illustrates a carrier device 15 according to an embodiment, and FIGS. 3 and 4 further illustrate a footboard portion of the carrier device where a battery box 153 is positioned. Although an electric scooter is illustrated in FIGS. 2-4, the disclosure is not limited thereto.

Referring to FIG. 2, the illustrated carrier device 15 that is an electric scooter has a footboard 152, a seat 154, and a storage compartment 155 under the seat 154. In an embodiment, the barcode associated with the carrier identifier of the carrier device 15 is positioned at a position under the seat 154 or inside the storage compartment 155, but the disclosure is not limited thereto.

Referring to FIGS. 3 and 4, according to an embodiment, a battery box 153 that can receive at least one battery device 12 (for example, two battery devices 12 as illustrated) is positioned in a space 150 under the footboard 152 of the carrier device 15. The battery box 153 may be driven by a motor (not shown) to elevate from the space 150 to reveal the battery device(s) 12, or to descend into the space 150 to conceal the battery device(s) 12. According to an embodiment, the footboard 152 and the battery box 153 are interlocked, such that the footboard 152 opens up the space 150 as the battery box 153 is elevated, and that the footboard 152 closes and covers the space 150 as the battery box 153 descends. In this way, it is easy to take out a battery device 12 from the carrier device 15 when the battery device 12 needs to be replaced or recharged.

The battery device(s) 12 is/are configured to be installed in the battery box 153 to provide electrical power to the carrier device 15. However, only battery device(s) 12 bound to the carrier device 15 is/are permitted to provide electrical power to the carrier device 15. Specifically, each time a battery device 12 is installed in the battery box 153, a vehicle control unit (VCU) 151 (see FIG. 1) of the carrier device 15 determines whether the stored data of the battery device 12 includes the carrier identifier of the carrier device 15 (the carrier identifier may be stored in the VCU 151 in advance during the manufacture of the carrier device 15). If so, the VCU 151 instructs the battery device 12 to provide electrical power to a power supply unit (not shown) fixed in the carrier device 15. If not, the VCU 151 would not instruct the battery device 12 to provide electrical power to the power supply unit of the carrier device 15, and the carrier device 15 cannot receive any electrical power from the battery device 12.

A method for battery binding may be implemented by the system 1 illustrated in FIG. 1. A first part of the method that includes steps 21-24 and a second part of the method that includes steps 25-27 are illustrated in FIGS. 5 and 6, respectively, according to an embodiment.

Figure 5:
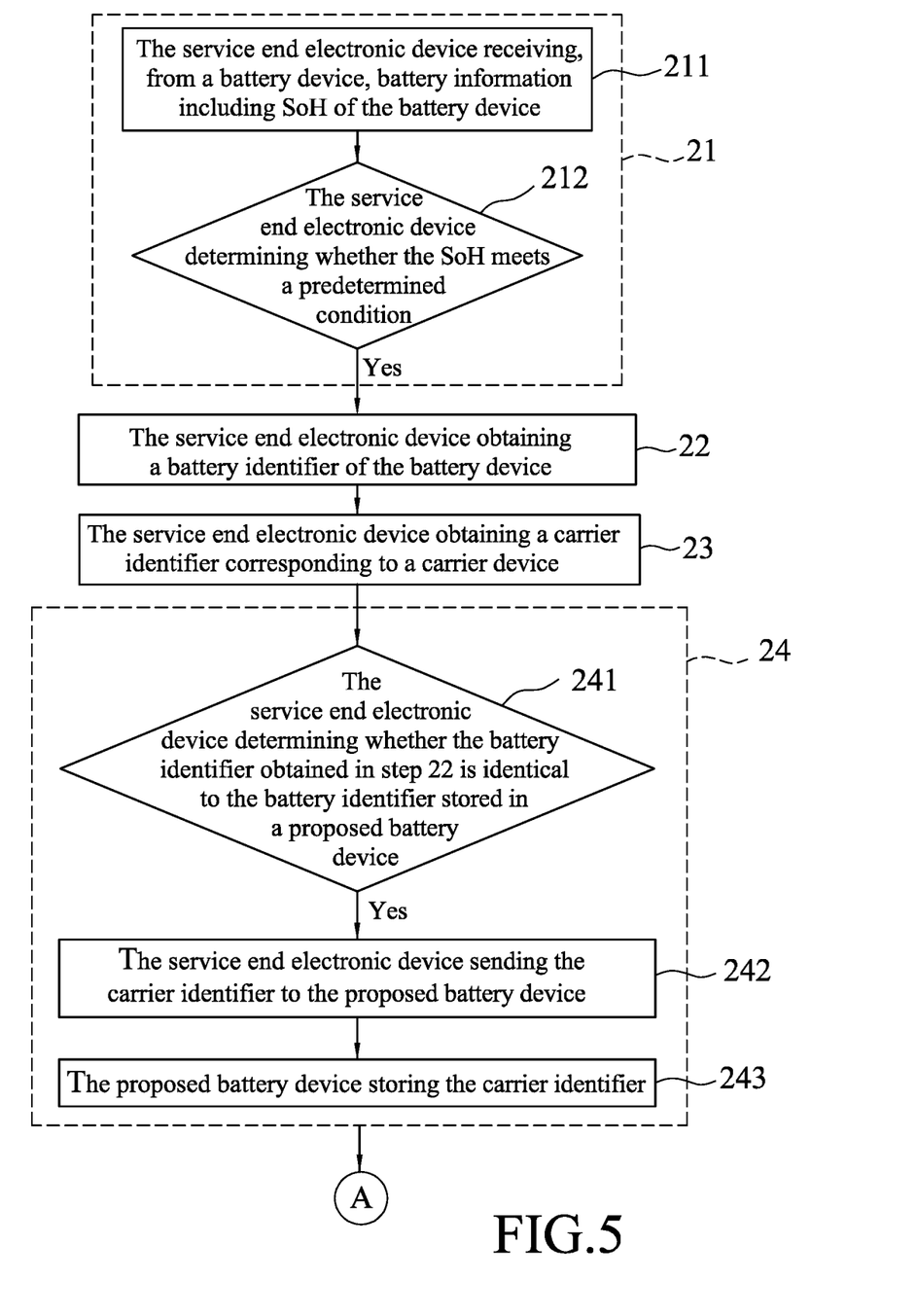
FIG. 5 is a flow chart which exemplarily illustrates a first part of a method for battery binding according to an embodiment.
Figure 6:
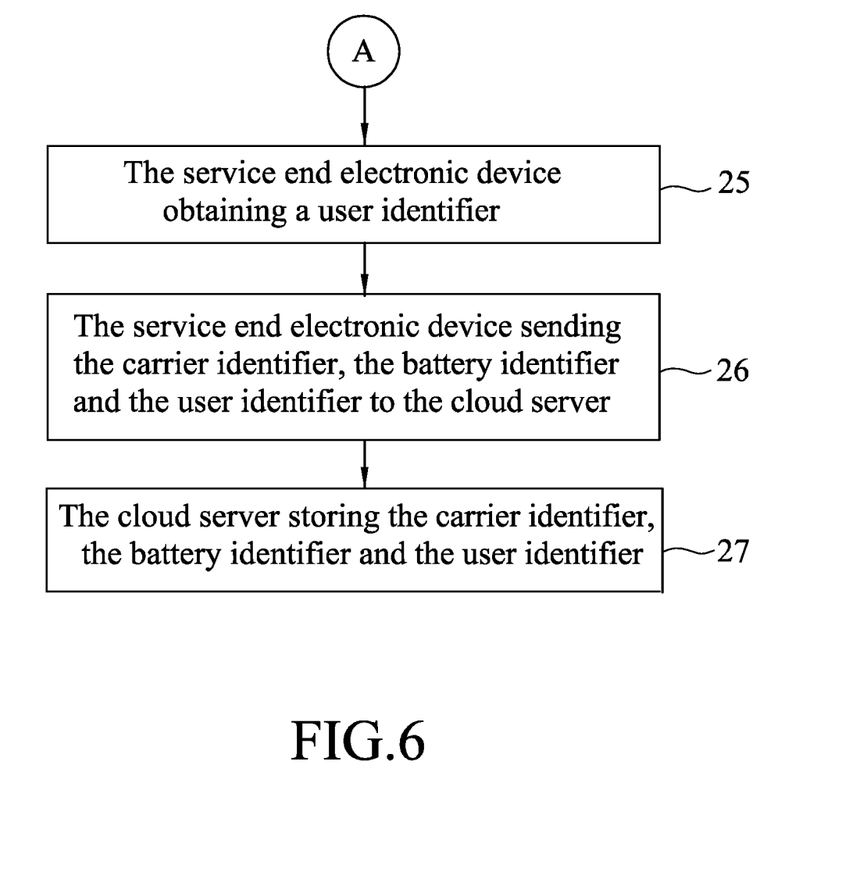
FIG. 6 is a flow chart which exemplarily illustrates a second part of the method for battery binding according to an embodiment.

Reference is now made to FIG. 5. In step 21, a determination as to whether a battery device 12 is healthy enough to be provided (e.g., sold or rent) to a customer (e.g., an owner of a carrier device 15) is made. Step 21 includes two sub-steps 211 and 212. In sub-step 211, the service end electronic device 11 communicates with the battery device 12 via near-field communication, and receives battery information from the battery device 12 that includes the state of health (SoH) of the battery device 12. The battery information may further include other information of the battery device 12, such as power consumption of battery discharge, remain capacity, capacity of full charge, voltage of the battery, charge/discharge current, cycle count of charge state, charging time, identifier number of the battery, software serial number of battery, and/or hardware serial number of battery. SoH is a ratio (in percentage) of a current, actual battery capacity of the battery device 12 to the specified battery capacity of the battery device 12 at the time of manufacture. A SoH of 100% means that the health condition of the battery device 12 meets its specification at the time of manufacture. Ideally, the SoH of the battery device 12 would be 100% at the time of manufacture, but the SoH may decline over time with use.

In sub-step 212, the service end electronic device 11 compares the SoH of the battery device 12 with a predetermined threshold, and determines whether the relationship between the SoH of the battery device 12 and the predetermined threshold meets a predetermined condition. The process proceeds to step 22 only when the predetermined condition is met. For example, the predetermined condition may be the SoH of the battery device 12 being greater than the predetermined threshold. As another example, the predetermined condition may be the SoH of the battery device 12 being not less than the predetermined threshold. The predetermined threshold may be, for example, 80%.

In step 22, the service end electronic device 11 obtains a battery identifier of the battery device 12, and stores the battery identifier in memory (now shown in FIG. 1) of the service end electronic device 11. The battery identifier may be obtained through, for example, scanning a barcode on the battery device 12 or through communication with the battery device 12 via near-field communication.

In step 23, the service end electronic device 11 obtains and stores a carrier identifier corresponding to a carrier device 15 in the memory of the service end electronic device 11. The carrier identifier may be obtained through, for example, scanning a barcode on the carrier device 15.

In step 24, the battery device 12 is bound to the carrier device 15 by storing the carrier identifier in the battery device 12 after a confirmation procedure related to the battery device 12. Step 24 includes sub-steps 241-243. In sub-step 241, the service end electronic device 11 determines whether the battery identifier obtained in step 22 is identical to the battery identifier stored in a battery device 12 proposed for binding (hereinafter also referred to as "the proposed battery device 12"), i.e., confirms whether the proposed battery device is the battery device that has passed the SoH examination of step 21. According to an embodiment, the service end electronic device 11 may first obtain the battery identifier stored in the proposed battery device 12 by communicating with the proposed battery device 12 via near-field communication or by scanning the barcode on the proposed battery device 12, and then compare the battery identifier obtained in step 22 with the battery identifier thus obtained from the proposed battery device 12. The process proceeds to sub-step 242 only when it is determined that the battery identifier obtained in step 22 is identical to the battery identifier stored in the proposed battery device 12.

In sub-step 242, the service end electronic device 11 sends the carrier identifier to the proposed battery device 12 through the NFC module 111. In a further embodiment, the service end electronic device 11 sends the battery identifier of the proposed battery device 12 along with the carrier identifier to the proposed battery device 12.

In sub-step 243, the proposed battery device 12 stores the carrier identifier received from the service end electronic device 11 in memory (not shown in FIG. 1) of the proposed battery device 12. In a further embodiment, the proposed battery device 12 also stores the battery identifier received from the service end electronic device 11. The proposed battery device 12 is thus bound to the carrier device 15. That is, the battery device 12 is now permitted to provide electrical power to the carrier device 15.

Reference is now made to FIG. 6. In step 25, the service end electronic device 11 obtains and stores a user identifier corresponding to a user of the carrier device 15. According to an embodiment, the service end electronic device 11 is installed with the first application program, and is configured to obtain the user identifier through scanning a barcode associated with the user identifier and displayed on the user end electronic device 14 of the user by executing the first application program. According to an embodiment, the user end electronic device 14 is installed with a second application program downloaded from the cloud server 13 over the communication network 10, and is configured to display the barcode associated with the user identifier after log-in of the user to the second application program. A first-time log-in of the user to the second application program requires the user to complete a registration procedure, including inputting personal information to a registration webpage provided by the second application program, the personal information including information about, for example, a vehicle license, a driver's license, a name, an address and/or a contact number. The barcode associated with the user identifier may be generated dynamically each time the user logs in, with a limited effective time for the sake of security. That is, the barcode generated each time the user logs in to the second application program is different, and is effective only for a limited time (e.g., one hour) before it expires. According to an embodiment, the barcode may be a 1D barcode or a 2D barcode (e.g., a QR code).

In step 26, the service end electronic device 11 sends the carrier identifier of the carrier device 15, the battery identifier of the battery device 12 and the user identifier of the user of the carrier device 15 to the cloud server 13 over the communication network 10.

In step 27, the cloud server 13 receives the carrier identifier, the battery identifier and the user identifier from the service end electronic device 11, and stores the carrier identifier, the battery identifier and the user identifier as an associated (interrelated) group. In an embodiment, the interrelationship of the carrier identifier, the battery identifier and the user identifier is specified in a lookup table stored in the cloud server 13. In this case, the battery device 12 is bound to the carrier device 15 and the user corresponding to the user identifier at the side of the cloud server 13. Afterwards, the service end electronic device 11 may use the battery identifier of the battery device 12 to inquire the identity of the owner/user of the battery device 12 through communication with the cloud server 13. The service end electronic device 11 may also use the battery identifier of the battery device 12 to inquire which carrier device 15 is allowed to use the battery device 12 through communication with the cloud server 13. The cloud server 13 may send a storage complete signal to the service end electronic device 11 after storing the carrier identifier, the battery identifier and the user identifier, and the service end electronic device 11 may delete the carrier identifier, the battery identifier and the user identifier stored therein in response to receiving the storage complete signal.

It can be appreciated that with the method disclosed and described above, a battery device 12 can be easily and rapidly bound to a designated carrier device 15 through operation of a service end electronic device 11. A beneficial characteristic of the disclosed method is that the SoH examination performed in step 21 prevents binding of an unhealthy battery device. That is, an EV owner/user is prevented from buying or renting an unhealthy or faulty battery device from the vendor. Another beneficial characteristic of the disclosed method is that the battery identifier examination performed in step 24 (in particular, sub-step 241) ensures that the battery device under operation is the right battery device, i.e., the battery device that is meant to be bound with the concerned carrier device.

Figure 7:
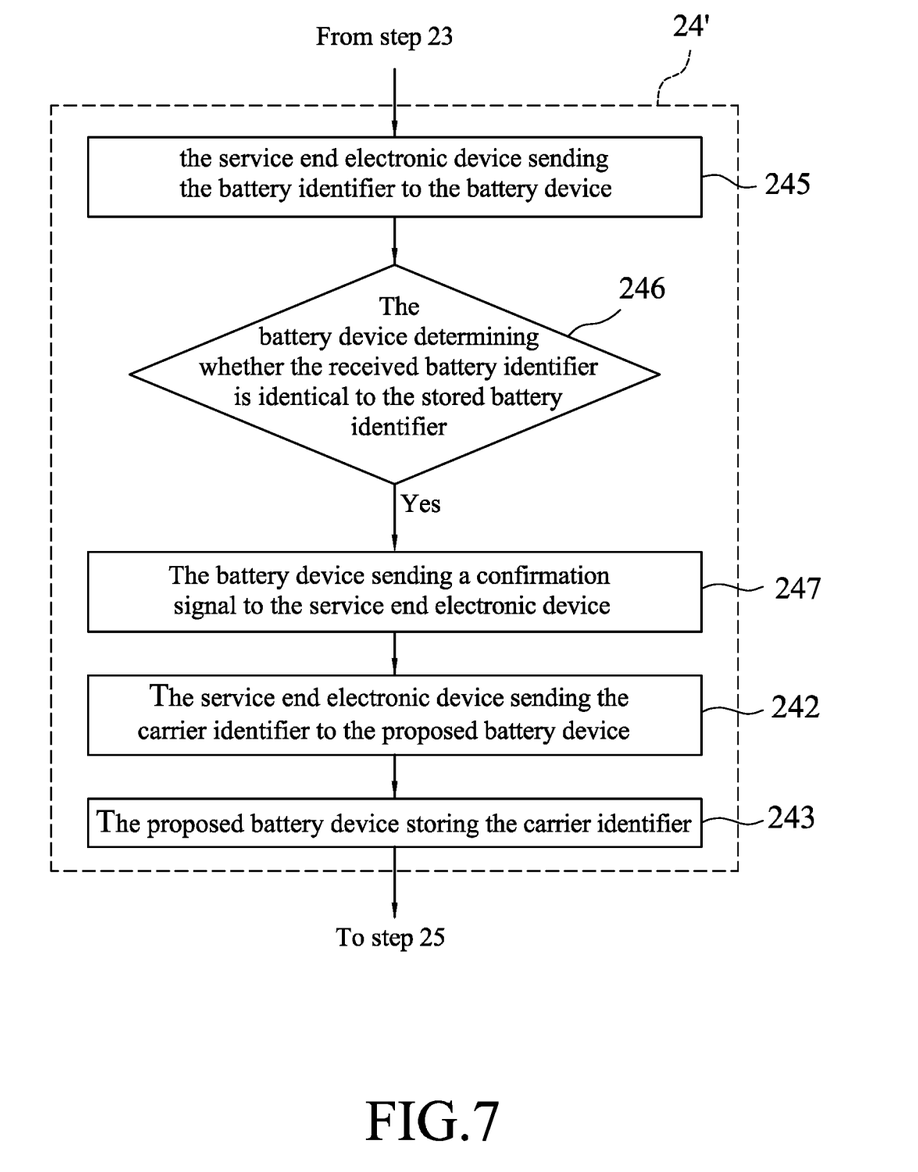
FIG. 7 is a flow chart which exemplarily illustrates an alternative first part of the method as illustrated in FIG. 5 according to an embodiment.

FIG. 7 further exemplarily illustrates an alteration of the method disclosed and described above. Specifically, FIG. 7 illustrates an alternative step 24' in place of step 24 in FIG. 5. Step 24' includes sub-steps 245-247 in place of sub-step 241 of step 24, while sub-steps 242 and 243 are the same as those of step 24.

In sub-step 245, the service end electronic device 11 sends the battery identifier to the battery device 12 proposed for binding via near-field communication.

In sub-step 246, the controller 122 of the battery device 12 receives the battery identifier from the service end electronic device 11, and determines whether the battery identifier received from the service end electronic device 11 is identical to the battery identifier stored in the proposed battery device 12. The process proceeds to sub-step 247 only when it is determined that the battery identifier received from the service end electronic device 11 is identical to the battery identifier stored in the proposed battery device 12.

In sub-step 247, the battery device 12 sends a confirmation signal to the service end electronic device 11.

The following sub-steps 242 and 243 have been described above with reference to FIG. 5, and are thus not repeated here. In a further embodiment, when the battery identifier received from the service end electronic device 11 is determined in sub-step 246 to be inconsistent with the stored battery identifier, the battery device 12 may send an error signal to the service end electronic device 11 to inform a user of the service end electronic device 11 (e.g., the vendor) that the battery device 12 proposed for binding is not the correct battery device 12.

One of ordinary skill in the relevant art would appreciate that it is not necessary for steps 21-27 to be performed in exactly the order illustrated in FIGS. 5 and 6. Specifically, step 23 may be performed before step 22, and step 25 may be performed at any time as long as it is performed before step 26.

Other alterations may be made to the method as well. For example, in an embodiment, step 25 is omitted, and only the carrier identifier and the battery identifier are sent to and stored in the cloud server 13 in steps 26 and 27. As another example, in an embodiment, the battery information the service end electronic device 11 receives from the battery device 12 in step 211 includes the battery identifier of the battery device 12. In this situation, step 22 can be omitted, and the battery identifier that is used in step 241 for comparison with the battery identifier stored in the proposed battery device 12 is the battery identifier obtained in step 211.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for battery binding that is to be implemented by a service end electronic device, the method comprising steps of:
    acquiring battery information from a battery device via near-field communication, the battery information including state of health of the battery device;
    determining if the state of health of the battery device is greater than a predetermined threshold;
    obtaining a battery identifier corresponding to the battery device;
    obtaining a carrier identifier corresponding to a carrier device that is capable of being electrically powered;
    determining whether the battery identifier thus obtained is identical to a battery identifier stored in the battery device; and
    when it is determined that the battery identifier thus obtained is identical to the battery identifier stored in the battery device, sending the carrier identifier to the battery device via near-field communication for storage in the battery device,
    wherein the step of obtaining a battery identifier, the step of obtaining a carrier identifier, the step of determining whether the battery identifier thus obtained is identical to a battery identifier stored in the battery device and the step of sending the carrier identifier are implemented when it is determined that the state of health is greater than the predetermined threshold.

2. The method of claim 1, wherein the carrier identifier is obtained through a barcode, the barcode being a Quick Response code at one of a position under a seat of the carrier device and a position inside a storage compartment of the carrier device.

3. The method of claim 1, wherein the step of sending the carrier identifier includes
    when it is determined that the battery identifier thus obtained is identical to the battery identifier stored in the battery device, sending the carrier identifier and the battery identifier to the battery device via near-field communication for storage of at least the carrier identifier in the battery device.

4. The method of claim 3, wherein:
    the carrier identifier is obtained through a barcode that is a Quick Response code at one of a position under a seat of the carrier device and a position inside a storage compartment of the carrier device; and
    the battery identifier corresponding to the battery device is obtained from the battery device via near-field communication or obtained through a barcode that is a Quick Response code located on a top portion of the battery device.

5. The method of claim 1, wherein:
the carrier identifier is obtained through a barcode that is a Quick Response code at one of a position under a seat of the carrier device and a position inside a storage compartment of the carrier device; and
the battery device stores both the battery identifier and the carrier identifier after completion of the step of sending the carrier identifier.

6. The method of claim 1, further comprising a step of:
obtaining a user identifier corresponding to a user of the carrier device in order to bind the battery device to the user.

7. The method of claim 6, wherein the user identifier is obtained through a barcode, the barcode being a Quick Response code displayed on a user end electronic device of the user.

8. The method of claim 6, comprising a step of:
sending, to a cloud server in communication with the service end electronic device over a communication network, at least one of the carrier identifier, the battery identifier and the user identifier over the communication network for storage in the cloud server, wherein the communication network is the Internet.

9. A system for battery binding, the system comprising:
a carrier device;
a battery device configured to be installed in said carrier device to provide electrical power to said carrier device; and
a service end electronic device configured to communicate with said battery device and to:
acquire battery information from said battery device via near-field communication, the battery information including state of health of said battery device;
determine if the state of health of said battery device is greater than a predetermined threshold;
obtain, from said battery device, a battery identifier of said battery device;
obtain, from said carrier device, a carrier identifier corresponding to said carrier device;
determine whether the battery identifier obtained from said battery device is identical to a battery identifier stored in said battery device; and
when it is determined that the battery identifier obtained from said battery device is identical to the battery identifier stored in said battery device, send the carrier identifier to said battery device via near-field communication for storage in said battery device,
wherein said service end electronic device is to obtain the battery identifier, obtain the carrier identifier, determine whether the battery identifier obtained from said battery device is identical to the battery identifier stored in said battery device and send the carrier identifier only when it is determined that the state of health is greater than the predetermined threshold.

10. The system of claim 9, wherein:
said carrier device includes a seat and a storage compartment, and has a barcode associated with the carrier identifier that is a Quick Response code at one of a position under said seat and a position inside said storage compartment; and
said service end electronic device is configured to obtain the carrier identifier through the barcode.

11. The system of claim 9, wherein said service end electronic device is further configured to:
acquire battery information from said battery device via near-field communication, the battery information including state of health of said battery device; and
determine if the state of health of said battery device is greater than a predetermined threshold;
wherein said service end electronic device is to obtain the battery identifier, obtain the carrier identifier, determine whether the battery identifier obtained from said battery device is identical to the battery identifier stored in said battery device and send the carrier identifier only when it is determined that the state of health is greater than the predetermined threshold,
wherein when it is determined that the battery identifier obtained from said battery device is identical to the battery identifier stored in said battery device, said service end electronic device is to send the battery identifier obtained from said battery device along with the carrier identifier to said battery device via near-field communication for storage of at least the carrier identifier in said battery device.

12. The system of claim 11, wherein:
said battery device has a barcode associated with the battery identifier of said battery device that is a Quick Response code located on a top portion of said battery device; and
said service end electronic device is configured to obtain the battery identifier of said battery device through the barcode.

13. The system of claim 11, wherein:
said service end electronic device includes a near-field communication module;
said battery device includes a near-field communication module; and
said near-field communication module of said service end electronic device is configured to communicate with said near-field communication module of said battery device in order to send the carrier identifier and the battery identifier of said battery device to said battery device.

14. The system of claim 9, wherein:
said carrier device includes a seat and a storage compartment, and has a barcode associated with the carrier identifier that is a Quick Response code at one of a position under said seat and a position inside said storage compartment;
said service end electronic device is configured to obtain the carrier identifier through the barcode; and
said battery device is configured to store the carrier identifier after receiving the carrier identifier from said service end electronic device.

15. The system of claim 9, further comprising:
a cloud server configured to communicate with said service end electronic device over a communication network which is the Internet; and
a user end electronic device configured to communicate with said cloud server over the communication network,
wherein said service end electronic device is installed with a first application program, and is configured to obtain the carrier identifier by executing the first application program,
wherein said user end electronic device is installed with a second application program, and is configured to display a barcode associated with a user identifier corresponding to a user of said carrier device after log-in of the user to the second application program, the barcode being a Quick Response code, wherein said service end electronic device is further configured to:

obtain the user identifier through the barcode displayed on said user end electronic device; and send the carrier identifier, the battery identifier of said battery device and the user identifier to said cloud server over the communication network for storage in said cloud server.

16. A method for battery binding, the method comprising steps of:

acquiring, by a service and electronic device, battery information from a battery device that includes a controller via near-field communication, the battery information including state of health of the battery device;

determining, by the service end electronic device, if the state of health of the battery device is greater than a predetermined threshold;

obtaining by the service end electronic device, a battery identifier corresponding to the battery device;

obtaining, by the service end electronic device, a carrier identifier corresponding to a carrier device;

sending, by the service end electronic device, the battery identifier thus obtained to the battery device;

determining, by the controller of the battery device upon receiving the battery identifier received from the service end electronic device, whether the battery identifier thus received is identical to a battery identifier stored in the battery device;

sending, by the controller of the battery device, a confirmation signal to the service end electronic device when it is determined that the battery identifier received from the service end electronic device is identical to the battery identifier stored in the battery device; and sending, by the service end electronic device upon receiving the confirmation signal, the carrier identifier to the battery device via near-field communication for storage in the battery device, wherein the step of obtaining a battery identifier, the step of obtaining a carrier identifier, the step of sending the battery identifier, the step of determining whether the battery identifier thus received is identical to a battery identifier stored in the battery device, the step of sending a confirmation signal and the step of sending the carrier identifier are implemented when it is determined that the state of health is greater than the predetermined threshold.

17. A system for battery binding, the system comprising:

a carrier device;

a battery device configured to be installed in said carrier device to provide electrical power to said carrier device; and a service end electronic device configured to communicate with said battery device and to:

acquire battery information from said battery device via near-field communication, the battery information including state of health of said battery device;

determine if the state of health of said battery device is greater than a predetermined threshold, obtain, from said battery device, a battery identifier of said battery device;

obtain, from said carrier device, a carrier identifier corresponding to said carrier device; and send the battery identifier to said battery device, wherein said service end electronic device is to obtain the battery identifier, obtain the carrier identifier and send the battery identifier only when it is determined that the state of health is greater than the predetermined threshold, wherein said battery device includes a controller configured to:

upon receiving the battery identifier from said service end electronic device, determine whether the battery identifier received is identical to a battery identifier stored in said battery device; and send a confirmation signal to said service end electronic device when it is determined that the battery identifier received from said service end electronic device is identical to the battery identifier stored in said battery device, wherein said service end electronic device is further configured to:

upon receiving the confirmation signal from said battery device, send the carrier identifier to said battery device via near-field communication for storage in said battery device.

* * * * *